(12) United States Patent
Carey et al.

(10) Patent No.: US 8,351,165 B2
(45) Date of Patent: *Jan. 8, 2013

(54) CURRENT-PERPENDICULAR-TO-THE-PLANE (CPP) MAGNETORESISTIVE SENSOR WITH COFEGE FERROMAGNETIC LAYERS AND AG OR AGCU SPACER LAYER

(75) Inventors: Matthew J. Carey, San Jose, CA (US); Jeffrey R. Childress, San Jose, CA (US); Stefan Maat, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 273 days.

This patent is subject to a terminal disclaimer.

(21) Appl. No.: 12/904,060

(22) Filed: Oct. 13, 2010

(65) Prior Publication Data

US 2011/0026168 A1 Feb. 3, 2011

Related U.S. Application Data

(63) Continuation-in-part of application No. 11/781,576, filed on Jul. 23, 2007, now Pat. No. 7,826,182.

(51) Int. Cl.
*G11B 5/39* (2006.01)

(52) U.S. Cl. ............... 360/324.12; 360/324.11

(58) Field of Classification Search ........ 360/324–324.2
See application file for complete search history.

(56) References Cited

U.S. PATENT DOCUMENTS

| 6,905,780 | B2 | 6/2005 | Yuasa et al. |
| 7,381,480 | B2 | 6/2008 | Nakamura et al. |
| 7,672,092 | B2 * | 3/2010 | Tsuchiya et al. ......... 360/324.12 |
| 7,826,182 | B2 * | 11/2010 | Carey et al. .............. 360/324.12 |
| 8,154,829 | B2 * | 4/2012 | Carey et al. ............... 360/324.2 |
| 2002/0024780 | A1 * | 2/2002 | Mao et al. ................. 360/324.11 |
| 2002/0196591 | A1 * | 12/2002 | Hujanen et al. ............... 360/326 |
| 2005/0073778 | A1 | 4/2005 | Hasegawa et al. |

(Continued)

FOREIGN PATENT DOCUMENTS

| JP | 2008205110 A * 9/2008 |
| JP | 2010062191 A * 3/2010 |

OTHER PUBLICATIONS

Maat et al., "Current perpendicular to the plane spin-valves with CoFeGe magnetic layers", Appl. Phys. Lett. 93, 143505 (2008), Published Oct. 10, 2008.

*Primary Examiner* — Will J Klimowicz
(74) *Attorney, Agent, or Firm* — Thomas R. Berthold

(57) ABSTRACT

A current-perpendicular-to-the-plane spin-valve (CPP-SV) magnetoresistive sensor has a ferromagnetic alloy comprising Co, Fe and Ge in the sensor's free layer and/or pinned layer and a spacer layer of Ag, Cu or a AgCu alloy between the free and pinned layers. The sensor may be a simple pinned structure, in which case the pinned layer may be formed of the CoFeGe ferromagnetic alloy. Alternatively, the sensor may have an AP-pinned layer structure, in which case the AP2layer may be formed of the CoFeGe ferromagnetic alloy. The Ge-containing alloy comprises Co, Fe and Ge, wherein Ge is present in the alloy in an amount between about 20 and 40 atomic percent, and wherein the ratio of Co to Fe in the alloy is between about 0.8 and 1.2.

24 Claims, 6 Drawing Sheets

U.S. PATENT DOCUMENTS

| | | | |
|---|---|---|---|
| 2005/0128651 A1* | 6/2005 | Yi et al. | 360/324.1 |
| 2006/0044705 A1 | 3/2006 | Hasegawa et al. | |
| 2006/0067017 A1 | 3/2006 | Yuasa et al. | |
| 2008/0198514 A1 | 8/2008 | Jogo et al. | |
| 2009/0323228 A1* | 12/2009 | Carey et al. | 360/319 |
| 2011/0043950 A1* | 2/2011 | Carey et al. | 360/320 |

* cited by examiner

CURRENT-PERPENDICULAR-TO-THE-PLANE (CPP) MAGNETORESISTIVE SENSOR WITH COFEGE FERROMAGNETIC LAYERS AND AG OR AGCU SPACER LAYER

RELATED APPLICATION

This application is a continuation-in-part of application Ser. No. 11/781,576 filed Jul. 23, 2007, now U.S. Pat. No. 7,826,182 B2.

BACKGROUND OF THE INVENTION

1. Field of the Invention

The invention relates generally to a current-perpendicular-to-the-plane (CPP) magnetoresistive sensor that operates with the sense current directed perpendicularly to the planes of the layers making up the sensor stack, and more particularly to a CPP sensor with improved ferromagnetic layers.

2. Background of the Invention

One type of conventional magnetoresistive sensor used as the read head in magnetic recording disk drives is a "spin-valve" (SV) sensor. A SV magnetoresistive sensor has a stack of layers that includes two ferromagnetic layers separated by a nonmagnetic electrically conductive spacer layer, which is typically copper (Cu). One ferromagnetic layer has its magnetization direction fixed, such as by being pinned by exchange coupling with an adjacent antiferromagnetic layer, and the other ferromagnetic layer has its magnetization direction "free" to rotate in the presence of an external magnetic field. With a sense current applied to the sensor, the rotation of the free-layer magnetization relative to the fixed-layer magnetization is detectable as a change in electrical resistance.

In a magnetic recording disk drive SV read sensor or head, the magnetization of the fixed or pinned layer is generally perpendicular to the plane of the disk, and the magnetization of the free layer is generally parallel to the plane of the disk in the absence of an external magnetic field. When exposed to an external magnetic field from the recorded data on the disk, the free-layer magnetization will rotate, causing a change in electrical resistance. If the sense current flowing through the SV is directed parallel to the planes of the layers in the sensor stack, the sensor is referred to as a current-in-the-plane (CIP) sensor, while if the sense current is directed perpendicular to the planes of the layers in the sensor stack, it is referred to as a current-perpendicular-to-the-plane (CPP) sensor. CPP-SV read heads are described by A. Tanaka et al., "Spin-valve heads in the current-perpendicular-to-plane mode for ultra-high-density recording", *IEEE TRANSACTIONS ON MAGNETICS*, 38 (1): 84-88 Part 1 January 2002.

The fixed or pinned ferromagnetic layer in a CPP-SV sensor used in read heads may be a single pinned layer or an antiparallel (AP) pinned structure. The AP-pinned structure has first (AP1) and second (AP2) ferromagnetic layers separated by a nonmagnetic antiparallel coupling (APC) layer with the magnetization directions of the two AP-pinned ferromagnetic layers oriented substantially antiparallel. The AP2 layer, which is in contact with the nonmagnetic APC layer on one side and the sensor's Cu spacer on the other side, is typically referred to as the reference layer. The AP1 layer, which is typically in contact with an antiferromagnetic or hard magnet pinning layer on one side and the nonmagnetic APC layer on the other side, is typically referred to as the pinned layer. If the AP-pinned structure is the "self-pinned" type, then no pinning layer is required. In a self-pinned structure where no antiferromagnet or hard magnet pinning layer is present, the AP1 layer is in contact with a seed layer on the sensor substrate. The AP-pinned structure minimizes magnetostatic coupling between the reference layer and the CPP-SV free ferromagnetic layer. The AP-pinned structure, also called a "laminated" pinned layer, and sometimes called a synthetic antiferromagnet (SAF), is described in U.S. Pat. No. 5,465,185.

In CPP-SV sensors, because the sense current flows perpendicular to all the layers in the sensor stack, the electrical resistance of the active region (the free layer, spacer layer and pinned layer) is a relatively small part of the total resistance of the sensor. Antiferromagnetic pinning layers such as PtMn or IrMn do not contribute to the magnetoresistance signal; rather they constitute a parasitic resistance that decreases the overall signal significantly since its magnitude can be similar or greater than the total resistance of the active part of the spin-valve structure. Typical resistivities are 193 $\mu\Omega$cm as-deposited and 227 $\mu\Omega$cm after annealing for 4 hrs at 255° C. for PtMn and 150 $\mu\Omega$cm as-deposited and 162 $\mu\Omega$cm after annealing for 4 hrs at 255° C. for IrMn. PtMn needs to be about 150 Å thick to become antiferromagnetically ordered upon annealing to induce exchange in the pinned layer, IrMn needs to be about 80 Å thick to obtain optimum exchange bias. This translates to a serial resistance-area product (RA) value of 34 $\Omega\mu m^2$ for a PtMn pinned spin-valve, and 12 $m\Omega\mu m^2$ for a IrMn pinned spin-valve due to the antiferromagnet only (excluding possible underlayers). This parasitic resistance is large compared to a typical magnetoresistance $\Delta$RA originating from the active region. It is thus desirable to increase the resistance of the active region without significantly increasing the total stack resistance.

The materials making up the free layer and the pinned layer (either the single pinned layer or the AP2 layer in an AP-pinned structure) are typically crystalline alloys of CoFe or NiFe. These materials have a relatively low electrical resistivity ($\rho$) and thus do not contribute significantly to the magnetoresistance $\Delta$RA of the active region. Moreover, it is known that an increase in $\rho$ in the materials making up the free layer and the pinned layer is associated with a shortening of the spin diffusion length (SDL). It is desirable to shorten SDL to the extent that it becomes comparable to the thickness of the magnetic layers in the active region, which means that more of the active region is available for bulk electron scattering. This results in an increase in the magnetoresistance ($\Delta$R/R) of the CPP read head. For example, the SDL for crystalline CoFe alloys is greater than the typical thickness of AP2, which is about 15-30 Å, so that not all of the thickness of the AP2 layer is being used for bulk electron scattering.

What is needed is a CPP-SV sensor with improved ferromagnetic materials for the free and pinned layers that increase the magnetoresistance of the sensor.

SUMMARY OF THE INVENTION

The invention is a CPP-SV magnetoresistive sensor with a ferromagnetic alloy comprising Co, Fe and Ge in the free layer and/or the pinned layer structure and a spacer layer of Ag, Cu or a AgCu alloy between the free and pinned layers. The sensor may be a simple pinned structure, in which case the pinned layer may be formed of the CoFeGe ferromagnetic alloy. Alternatively, the sensor may have an AP-pinned layer structure, in which case the AP2 layer may be formed of the CoFeGe ferromagnetic alloy. The sensor may also be a dual-spin-valve sensor, where two similar pinned layer structures are arranged symmetrically on either side of a single free layer structure. The free layer structure may be a standard free layer structure, or (in the case of a single-spin-valve) an antiparallel-coupled free (APF) layer of two magnetic layers of unequal magnetization coupled antiparallel to each other. The Ge-containing alloy comprises Co, Fe and Ge, wherein Ge is present in the alloy in an amount between about 20 and 40 atomic percent, and wherein the ratio of Co to Fe in the alloy is between about 0.8 and 1.2. More particularly, the CoFeGe alloy may consist essentially of only Co, Fe and Ge according to the formula $(Co_xFe_{100-x})_{(100-y)}Ge_y$, where the subscripts represent atomic percent, x is between about 45 and 55, and y is between about 23 and 37.

For a fuller understanding of the nature and advantages of the present invention, reference should be made to the following detailed description taken together with the accompanying figures.

DETAILED DESCRIPTION OF THE INVENTION

Figure 1:
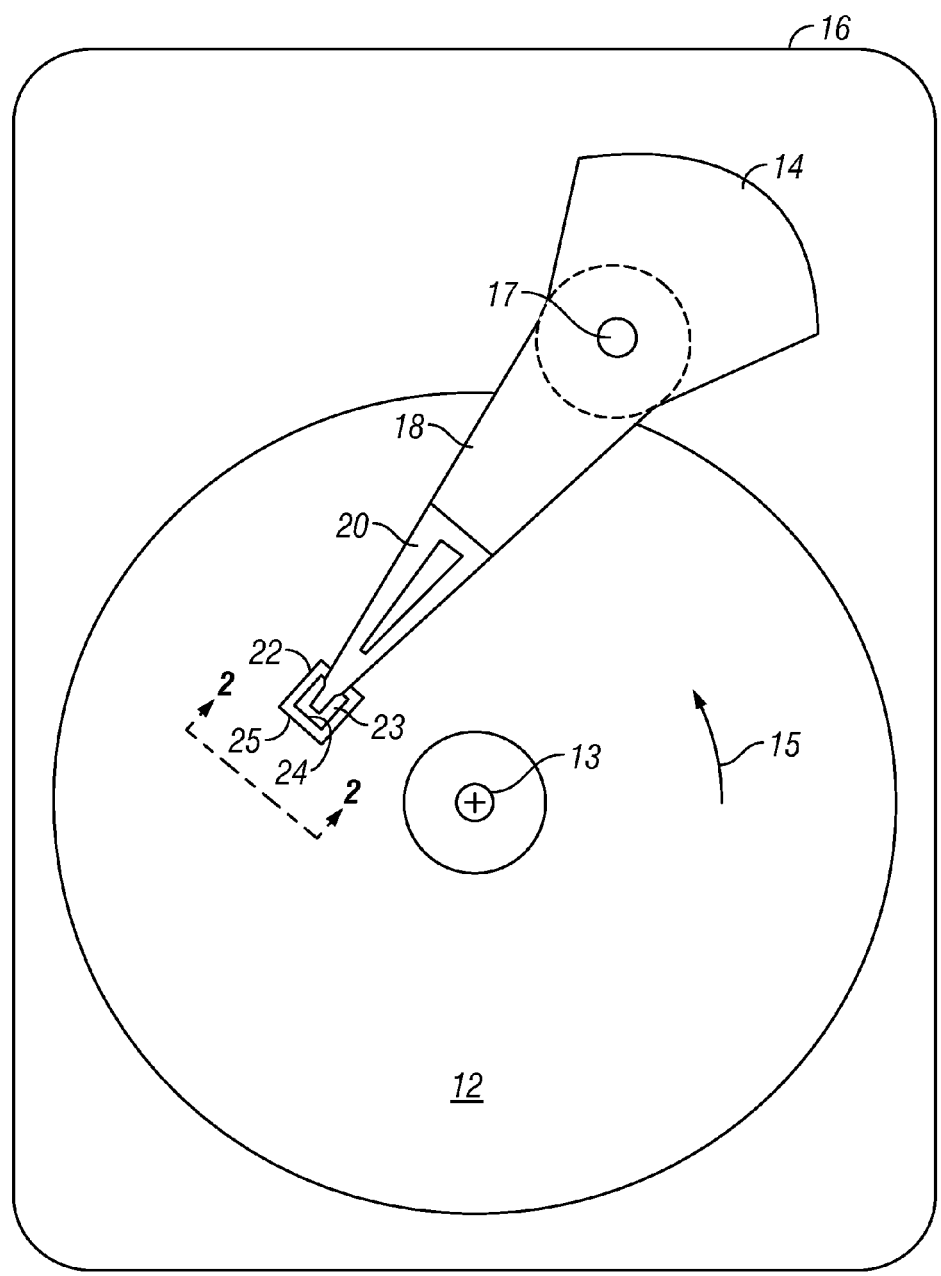
FIG. 1 is a schematic top view of a conventional magnetic recording hard disk drive with the cover removed.

The CPP-SV read head has application for use in a magnetic recording disk drive, the operation of which will be briefly described with reference to FIGS. 1-3. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
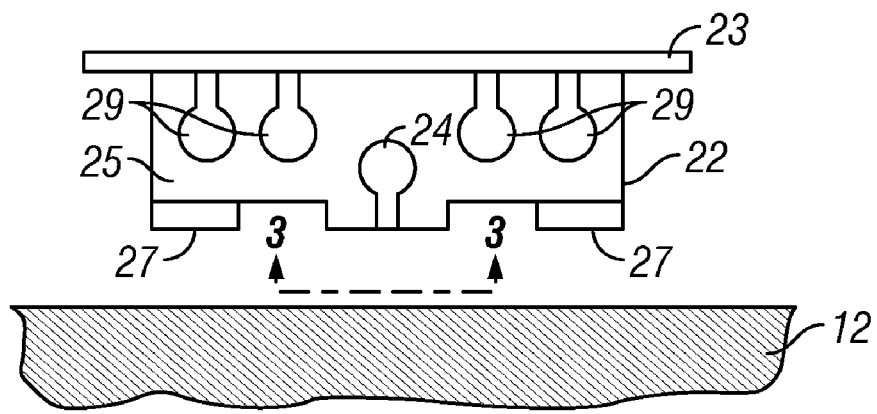
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25.

Figure 3:
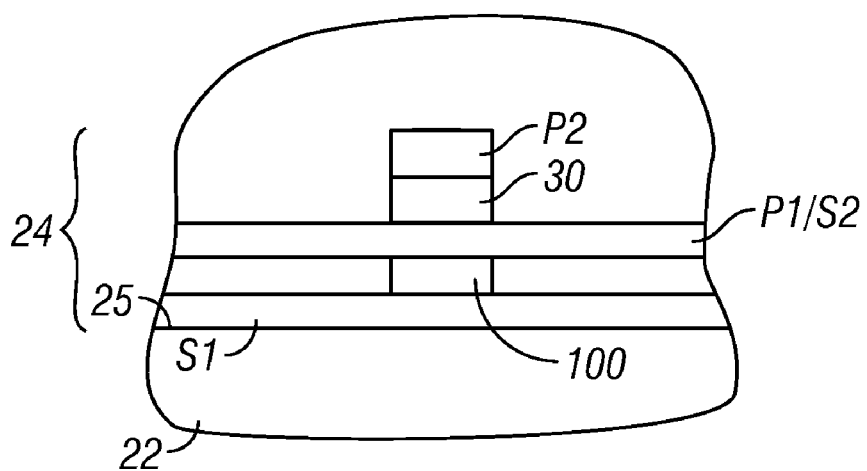
FIG. 3 is a view in the direction 3-3 of FIG. 2 and shows the ends of the read/write head as viewed from the disk.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes magnetic write poles P1/S2 and P1 separated by a write gap 30. The CPP-SV magnetoresistive sensor or read head 100 is located between two magnetic shields S1 and P1/S2, with P1/S2 also serving as the first write pole for the write head. The shields S1, S2 are formed of magnetically permeable material and are electrically conductive so they can function as the electrical leads to the read head 100. Separate electrical leads may also be used, in which case the read head 100 is formed in contact with layers of electrically conducting lead material, such as tantalum, gold, or copper, that are in contact with the shields S1, S2.

Figure 4:
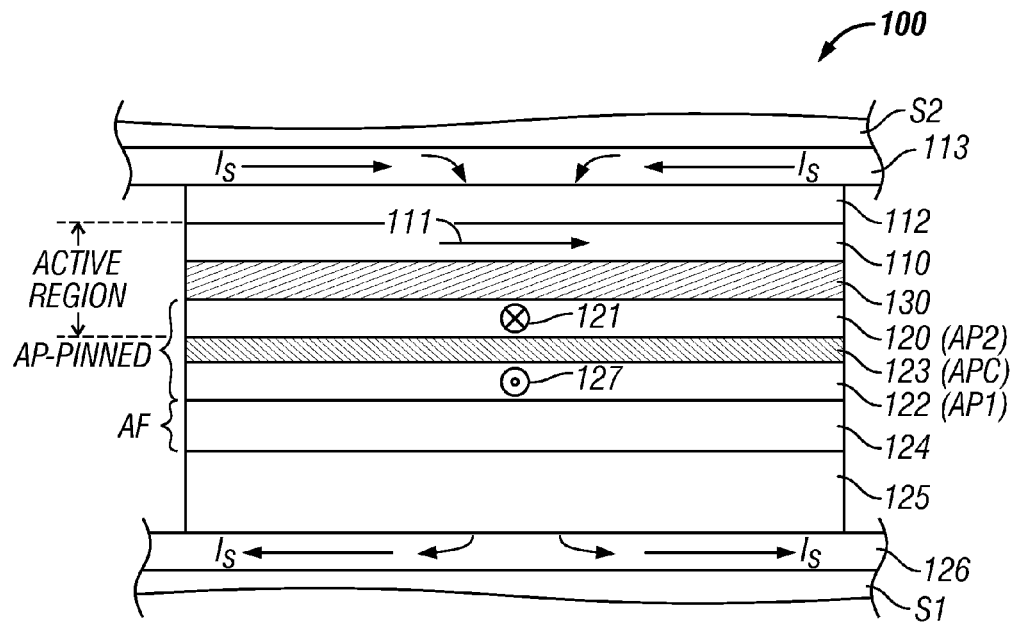
FIG. 4 is a cross-sectional schematic view of a CPP-SV read head showing the stack of layers located between the magnetic shield layers.

FIG. 4 is an enlarged sectional view showing the layers making up sensor 100. Sensor 100 is a CPP-SV read head comprising a stack of layers formed between the two magnetic shield layers S1, S2 that are typically electroplated NiFe alloy films. The lower shield S1 is typically polished by chemical-mechanical polishing (CMP) to provide a smooth substrate for the growth of the sensor stack. This may leave an oxide coating which can be removed with a mild etch just prior to sensor deposition. The sensor layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and an electrically conducting spacer layer 130, typically copper (Cu), between the reference layer 120 and free layer 110.

The reference layer 120 is part of the well-known antiparallel (AP) pinned structure, also called a "laminated" pinned layer, as described in U.S. Pat. No. 5,465,185. The AP-pinned structure minimizes magnetostatic coupling of the reference layer 120 with the free layer 110. The AP-pinned structure includes the reference ferromagnetic (AP2) layer 120 and a lower ferromagnetic (AP1) layer 122 that are antiferromagnetically coupled across an AP coupling (APC) layer 123, such as Ru, Ir, Rh, or Cr, or alloys thereof. The free ferromagnetic layer 110, spacer layer 130 and AP2 layer 120 together make up what is call the "active region" of the sensor. The AP1 and AP2 ferromagnetic layers have their respective magnetization directions 127, 121 oriented antiparallel. The AP-pinned structure may be "self-pinned" or the AP1 layer 122 may have its magnetization direction pinned by being exchange-coupled to an antiferromagnetic (AF) layer 124 or pinned by a hard magnetic layer such as $Co_{100-x}Pt_x$ or $Co_{100-x-y}Pt_xCr_y$ (where x is between about and 8 and 30 atomic percent). In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar magnetic moments. This assures that the net magnetic moment of the AP-pinned structure is small so that magnetostatic coupling to the free layer is minimized and the effective pinning field of the AF layer 124, which is approximately inversely proportional to the net magnetization of the AP-pinned structure, remains high. In the case of a hard magnetic pinning layer, the hard magnetic pinning layer moment needs to be accounted for when balancing the moments of AP1 and AP2 to minimize magneto-static coupling to the free layer.

Located between the lower shield layer S1 and the AP-pinned structure are the bottom electrical lead 126 and a seed layer 125. The seed layer 125 may be a single layer or multiple layers of different materials. Located between the free ferromagnetic layer 110 and the upper shield layer S2 are a capping layer 112 and the top electrical lead 113. The capping layer 112 may be a single layer or multiple layers of different materials, such as Cu, Ru, Rh or Ta.

In the presence of an external magnetic field in the range of interest, i.e., magnetic fields from recorded data on the disk 12, the magnetization direction 111 of free layer 110 will rotate while the magnetization direction 121 of reference layer 120 will remain fixed and not rotate. Thus when a sense current $I_S$ is applied from top lead 113 perpendicularly through the stack to bottom lead 126, the magnetic fields from the recorded data on the disk will cause rotation of the free-layer magnetization 111 relative to the reference-layer magnetization 121, which is detectable as a change in electrical resistance.

The leads 126, 113 are typically Ta or Rh. However, a lower resistance material may also be used. They are optional and used to adjust the shield-to-shield spacing. If the leads 126 and 113 are not present, the bottom and top shields S1 and S2 are used as leads. The seed layer 125 is typically one or more layers of NiFeCr, NiFe, Ta, Cu or Ru. The AF layer 124 is typically a Mn alloy, e.g., PtMn, NiMn, FeMn, IrMn, PdMn, PtPdMn or RhMn. If a hard magnetic layer is used instead of an AF layer it is typically a CoPt or FePt alloy, for example CoPtCr. The capping layer 112 provides corrosion protection and is typically formed of Ru or Ta.

The ferromagnetic layers 122 AP1), 120 (AP2), and 110 (free layer) are typically formed of a crystalline alloy such as CoFe or NiFe, or a multilayer of these materials, such as a CoFe/NiFe bilayer. These alloys have a sufficiently high magnetic moment M, a moderate bulk electron scattering parameter $\beta$, but a relatively low electrical resistivity $\rho$. For example, for $Co_{50}Fe_{50}$, $\rho$ is approximately 10.6 $\mu\Omega$-cm and M is approximately 1550 emu/cc.

The AP2 layer can also be a laminated structure to obtain a high degree of spin-dependent interface scattering. For example the AP2 layer can be a FM/XX/FM/ . . . /XX/FM laminate, where the ferromagnetic (FM) layers are formed of Co, Fe or Ni, one of their alloys, or a multilayer of these materials, such as a CoFe—NiFe—CoFe trilayer; and the XX layers are nonmagnetic layers, typically Cu, Ag, Ge, Al, Ti, or Au or their alloys, and are thin enough that the adjacent FM layers are ferromagnetically coupled.

For example, AP2 layer 120 may be a CoFe alloy, typically 10 to 30 Å thick, and the free ferromagnetic layer 110 may be a bilayer of a CoFe alloy, typically 10-15 Å thick and formed on the spacer layer 130, and a NiFe alloy, typically 10-30 Å thick, formed on the CoFe layer. The APC layer in the AP-pinned structure is typically Ru or Ir with a thickness between about 4-10 Å.

A hard magnetic layer (not shown), such as a CoPt or CoCrPt layer, may also be included outside the sensor stack near the side edges of the free ferromagnetic layer 110 or in the stack for magnetic stabilization or longitudinal biasing of the free ferromagnetic layer 110.

One or more of the free layer 110, the AP2 layer 120, the capping layer 112 and the conductive nonmagnetic spacer layer 130 may also include a nano-oxide layer (NOL) to locally confine the current path and increase the effective resistance of the active region. A CoFe NOL may be formed, for example, by interrupting the deposition after some CoFe has been deposited somewhere in the free layer, the AP2 layer, the capping layer, or the conductive spacer layer and oxidizing its surface for several minutes in an $O_2$ or $O_2/Ar$ gas at 0.1-10 Torr. NOLs can be formed by oxidizing other materials, e.g., Cu/Al or Cu/Ti alloys or multilayers.

While the read head 100 shown in FIG. 4 is a "bottom-pinned" read head because the AP-pinned structure is below the free layer 110, the free layer 110 can be located below the AP-pinned structure. In such an arrangement the layers of the AP-pinned structure are reversed, with the AP2 layer 120 on top of and in contact with the spacer layer 130.

The present invention is the CPP-SV sensor essentially as described above, but wherein the free ferromagnetic layer 110 and/or AP2 layer 120 are formed of an alloy comprising Co, Fe and Ge, wherein Ge is present in the alloy in an amount between about 20 and 40 atomic percent, and wherein the ratio of Co to Fe in the alloy is between about 0.8 and 1.2. More particularly, the CoFeGe alloy may consist essentially of only Co, Fe and Ge according to the formula $(Co_x Fe_{(100-x)})_{(100-y)}Ge_y$, where the subscripts represent atomic percent, x is between about 45 and 55, and y is between about 23 and 37. If the CPP-SV sensor uses a conventional single pinned layer instead of the AP-pinned structure, then the single pinned layer may be formed of the CoFeGe alloy.

Figure 5:
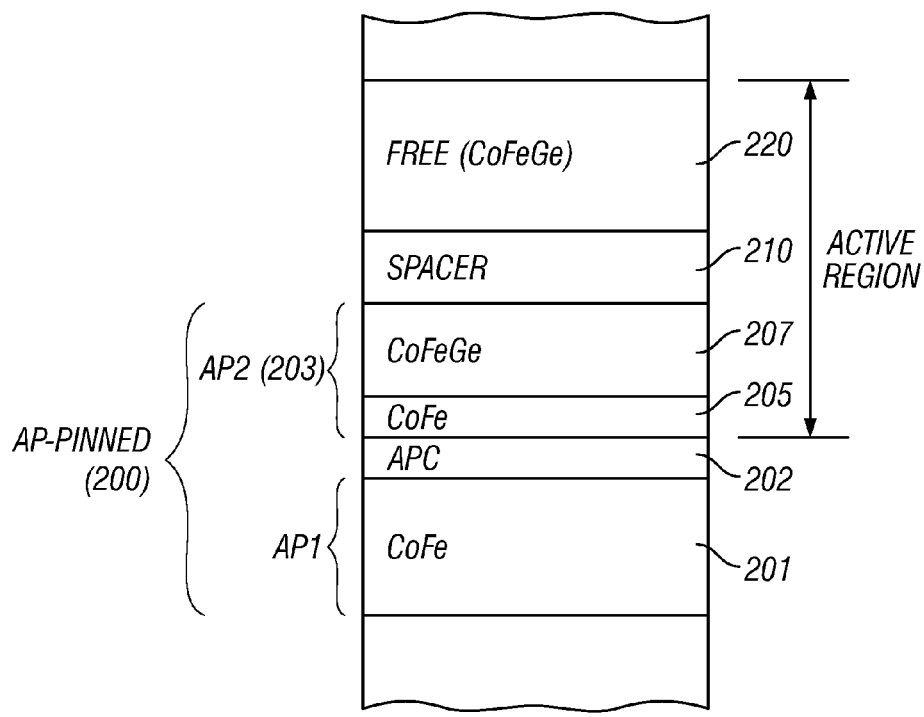
FIG. 5 is a cross-sectional schematic view of the AP-pinned structure of the present invention.

As illustrated in FIG. 5, in one embodiment of the CPP-SV sensor according to the invention the AP1 layer 201 is a crystalline ferromagnetic alloy of one or more of Co, Fe and Ni without Ge and the AP2 layer 203 comprises a multilayer of a first AP2 film 205 and a second AP2 film 207. Film 205 is located adjacent to the APC layer 202 of the AP-pinned layer structure 200 and is preferably a crystalline ferromagnetic alloy of one or more of Co, Fe and Ni without Ge to facilitate a strong antiferromagnetic coupling. Film 207 is the Ge-containing film according to this invention and is located adjacent the electrically conducting nonmagnetic spacer layer 210. The free layer 220 is located adjacent the spacer layer 210 and may also be formed of the Ge-containing alloy. Typical thicknesses for the layers shown in FIG. 5 are 15-40 Å for AP1, 3-9 Å for the APC, 4-15 Å for layer 205, 10-80 Å for layer 207, 25-100 Å for spacer layer 210 and 10-80 Å for free layer 220. The free layer 220 is shown in FIG. 5 as a single free layer comprising the Ge-containing alloy. However, like the AP2 layer, the free layer 220 may be a multilayer (not shown in FIG. 5) comprising a first film of the Ge-containing alloy, and a second film comprising a crystalline ferromagnetic alloy of one or more of Co, Fe and Ni without Ge. The Ge-containing film of a multilayer free layer is preferably located adjacent the spacer layer 210.

The addition of Ge to ferromagnetic layers in CPP-SV sensors has been previously suggested. For example, in US 2006/0044705 A1 a CPP sensor is described wherein at least one of the free and pinned ferromagnetic layers has the composition $(Co_{0.67} Fe_{0.33})_{100-a} Z_a$, wherein Z may represent at least one element selected from the group consisting of Al, Ga, Si, Ge, Sn, and Sb, and the parameter "a" is less than or equal to 30 in terms of atomic percent. However, in the present invention it has been discovered that a substantial increase in magnetoresistance occurs in $(Co_x Fe_{1-x})_{75} Ge_{25}$ alloys if the Co/Fe ratio is close to 1.0, preferably between about 0.8 and 1.2. This is shown in FIG. 6, wherein the Co fraction in the CoFe of the CoFeGe alloy was varied for a CPP structure with a AP-pinned layer and an antiparallel-coupled free (APF) layer according to the following:

[AP1=30 Å CoFe35]/8 Å Ru/[AP2=3 Å CoFe50/30 Å (CoFe)Ge25/5 Å CoFe50]
[SPACER=40 Å Cu]
[APF1=5 Å CoFe50/(60 Å (CoFe)Ge25/3 Å CoFe50]/8 Å Ru/[APF2=3 Å CoFe10/35 Å NiFe]

Figure 6:
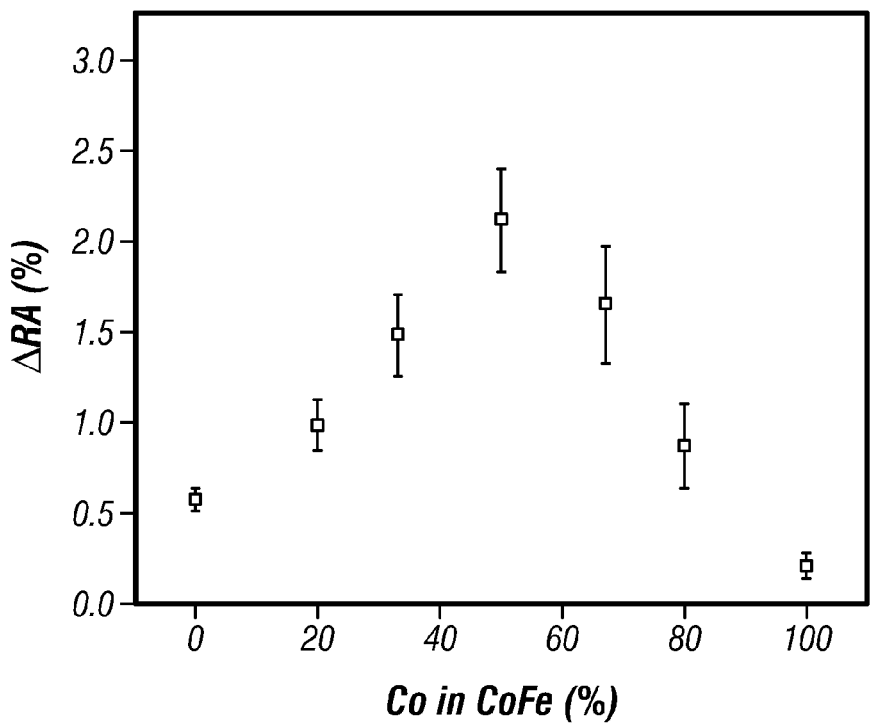
FIG. 6 is a graph of magnetoresistance as a function of Co fraction in the CoFe portion of the CoFeGe alloy for a CPP structure wherein the CoFeGe alloy is present in both the pinned and free layers.

As shown by FIG. 6, a substantial increase in magnetoresistance ($\Delta R/R$) occurs for a Co/Fe ratio of 1.0 (i.e., the CoFe in the $(Co_xFe_{1-x})_{75}Ge_{25}$ alloy has the composition $Co_{50}Fe_{50}$, where the subscripts are atomic percent). However, this precise ratio is not required, and as long as the ratio is between about 0.8 and 1.2, corresponding approximately to a composition of $(Co_xFe_{(100-x)})$ where x is between about 45 and 55, there is still an optimized magnetoresistance. The final Co/Fe ratio may be chosen to satisfy other magnetic properties such as coercivity and anisotropy.

The CoFeGe alloy, like the conventional CoFe, is crystalline. This has been determined experimentally using X-ray diffraction analysis of $(Co_{50}Fe_{50})_{(100-y)}Ge_y$ films with y between 7 and 40. In all cases the diffraction pattern showed a peak corresponding to the (110), (202), and (211) planes after annealing at 245 degrees C. for 5 hours. These annealing conditions are typical to initialize pinning with an antiferromagnet such as PtMn or IrMn in a spin-valve structure.

Figure 7:
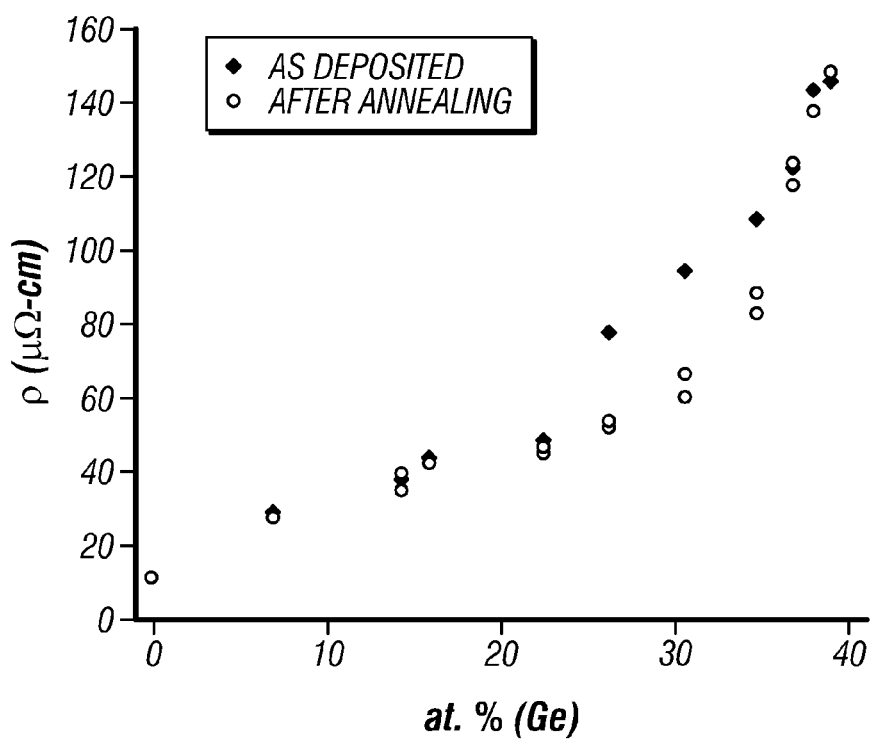
FIG. 7 is a graph of resistivity ρ as a function of atomic percent (at. %) Ge in a $[Co_{50}Fe_{50}]_{(100-y)}Ge_y$ alloy.

The addition of Ge increases the electrical resistivity of the ferromagnetic material, which is indicative of a shortening of the SDL. For crystalline $Co_{50}Fe_{50}$ $\rho$ is approximately 10.6 $\mu\Omega$cm. FIG. 7 is a graph of $\rho$ as a function of atomic percent (at. %) Ge in a $[Co_{50}Fe_{50}]_{(100-y)}Ge_y$ alloy. The resistivity is significantly greater than for the CoFe alloy without Ge, and increases from about 40 to about 90 $\mu\Omega$cm as the Ge is increased from about 20 to about 35 at. %.

Figure 8:
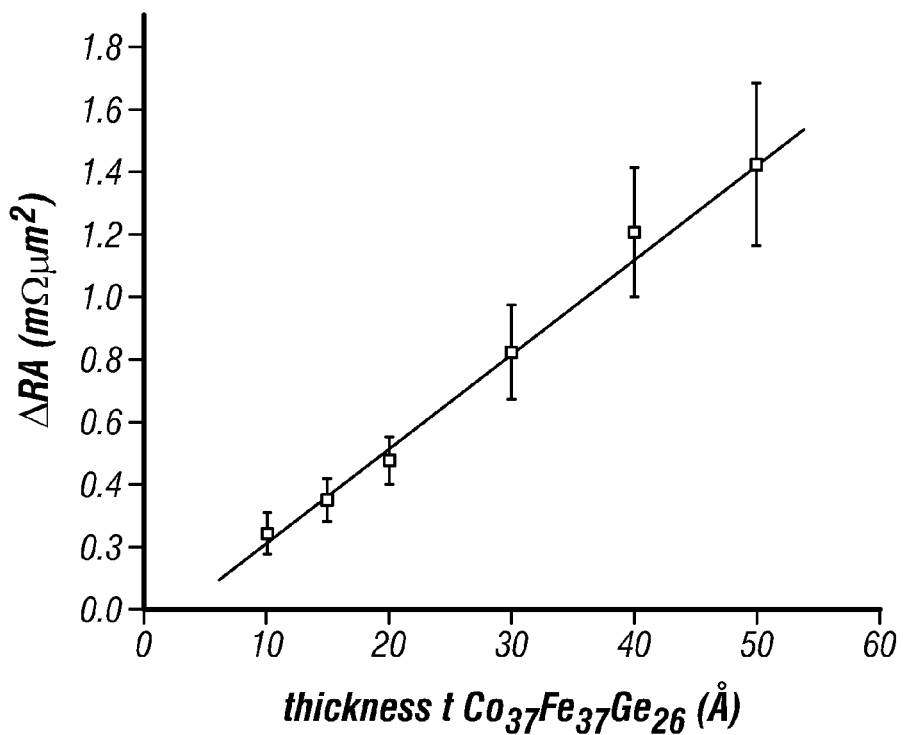
FIG. 8 is a graph of change in resistance-area product (ΔRA) versus thickness of a $(Co_{50}Fe_{50})_{74}Ge_{26}$ alloy used to calculate the bulk scattering parameter β.

The addition of Ge also significantly improves the bulk electron scattering parameter $\beta$ above that for just crystalline CoFe alloy. Preferably $\beta$ is 0.3 or higher at room temperature. By way of comparison, crystalline $Co_{90}Fe_{10}$ has a $\beta$ of about 0.40-0.45 at room temperature. FIG. 8 is a graph of resistance-area product ($\Delta RA$) versus thickness of a $(Co_{50}Fe_{50})_{74}Ge_{26}$ alloy free layer in a underlayer/IrMn/CoFe$_{50}$(30 Å)/Ru(8 Å)/CoFe$_{50}$(30 Å)/Cu(35 Å)/$(Co_{50}Fe_{50})_{74}Ge_{26}$ ($t_F$)/cap spin-valve. Clearly $\Delta RA$ increases about linearly over the thickness range investigated. Thus the $(Co_{50}Fe_{50})_{74}Ge_{26}$ spin-diffusion length is greater than 60 Å and the parallel resistor network model can be employed to describe the spin-transport for present spin-valves. Assuming total spin-memory loss in the Ru AP coupling layer and using the fact that most of the resistance of the spin-valve is parasitic, i.e. it originates from the antiferromagnet and other layers not contributing to the signal, $\beta$ can be calculated from present spin-valve data as $$\frac{\partial(RA)_{AP}}{\partial t_f} = \frac{\rho_f}{1-\beta^2},$$

where $(RA)_{AP}$ is the resistance-area product when the reference and free layers are in the antiparallel state, $t_f$ is the thickness of the free layer, and $\rho_f$ is the resistivity of the $(Co_{50}Fe_{50})_{74}Ge_{26}$ free layer as determined from sheet resistance measurements. From the above relation it can be determined that $\beta=0.77$, which is significantly higher than for a CoFe alloy without Ge.

Figure 9:
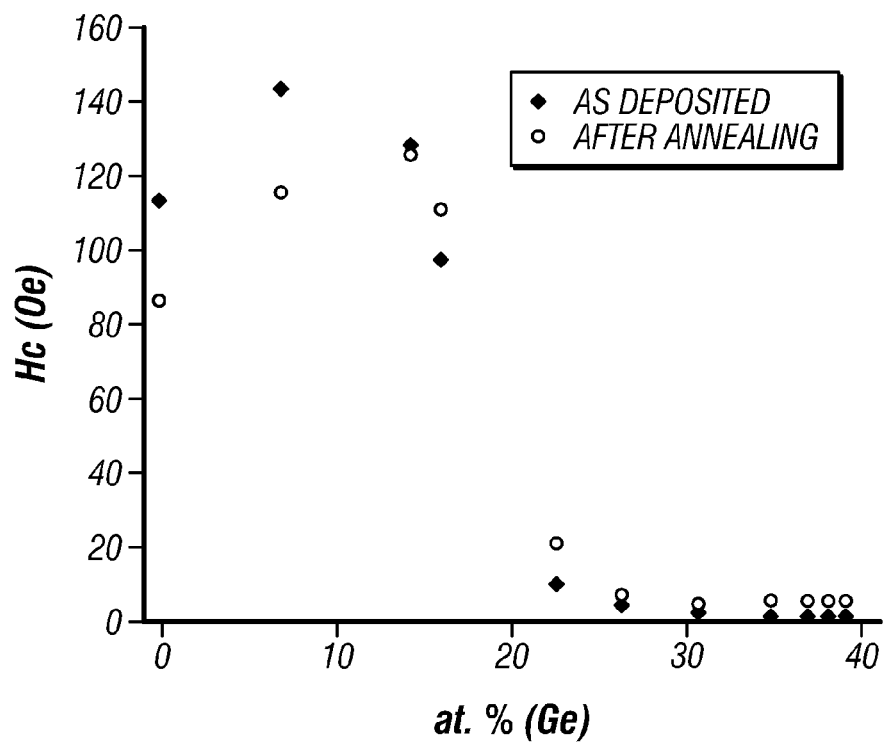
FIG. 9 is a graph of coercivity Hc as a function of atomic percent (at. %) Ge in a $(Co_{50}Fe_{50})_{(100-y)}Ge_y$ alloy.
Figure 10:
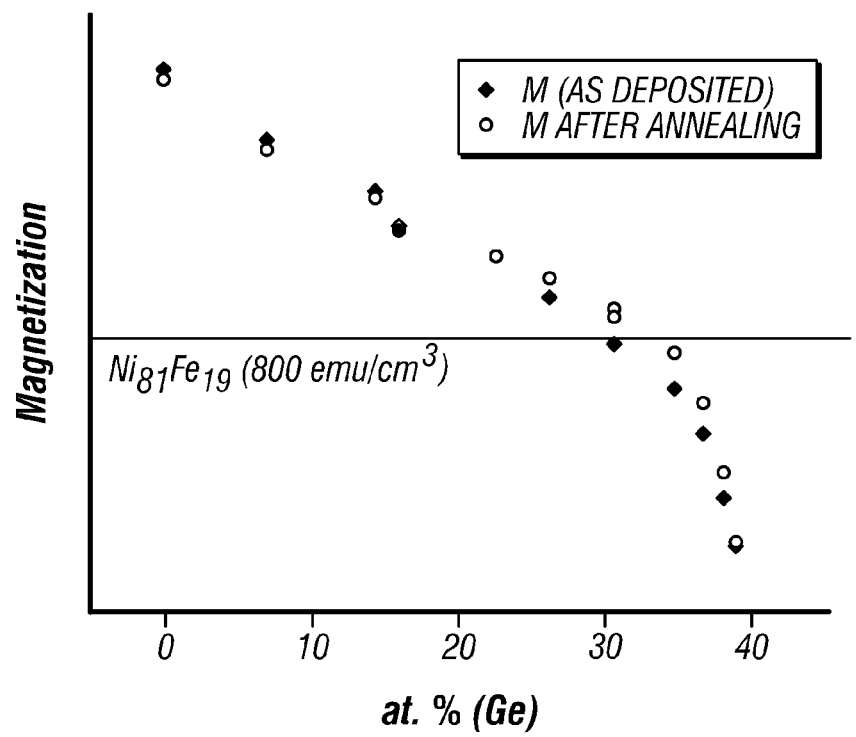
FIG. 10 is a graph of magnetization M in units of emu/cm² as a function of atomic percent (at. %) Ge in a $(Co_{50}Fe_{50})_{(100-y)}Ge_y$ alloy.

In addition to the requirement that the Co/Fe ratio be between about 0.8 and 1.2, the Ge must be present in an amount between about 20 to 40 atomic percent, preferably between about 23 to 37 atomic percent. This is shown by FIGS. 9 and 10. FIG. 9 is a graph of coercivity Hc as a function of atomic percent (at. %) Ge in a $(Co_{50}Fe_{50})_{(100-y)}Ge_y$ alloy. Hc drops sharply for Ge around 23 at. % and remains low for increasing amounts of Ge. $(Co_{50}Fe_{50})_{(100-y)}Ge_y$ hysteresis loops with Ge content of 23 at % and higher also exhibit a squareness close to 1. The low coercivity and high squareness of the hysteresis loops indicate high exchange interaction and low anisotropy. Low Hc and anisotropy are required for free layers. FIG. 10 is a graph of magnetization M in units of emu/cm$^2$ as a function of atomic percent (at. %) Ge in a $(Co_{50}Fe_{50})_{(100-y)}Ge_y$ alloy. The horizontal line represents the value of M=800 emu/cm$^2$ for a conventional $Ni_{81}Fe_{19}$ alloy used in free layers. The magnetization drops with increasing Ge content. Ge content above about 37 at. % renders the alloy unacceptable because the layers would have to be deposited too thick to get adequate moment. Thus the preferred range of Ge content is between about 23 and 37 at. % for a $(Co_{50}Fe_{50})_{(100-y)}Ge_y$ alloy, but may be a somewhat wider range of between about 20 and 40 at. % if the CoFe portion of the alloy is closer to $Co_{45}Fe_{55}$ or $Co_{55}Fe_{45}$.

The invention is also applicable to AP-pinned structures wherein the AP2 layer is a FM/XX/FM/ . . . /XX/FM laminate with at least one of the ferromagnetic (FM) layers being the Ge-containing ferromagnetic layer. The XX layers are nonmagnetic layers, typically Cu, Ag, Ge, Al, Ti, or Au or their alloys, and are thin enough that the adjacent Ge-containing FM layers are ferromagnetically coupled. This laminated AP2 layer would have at least two FM layers and one XX layer.

The CPP-SV magnetoresistive sensor with the improved AP-pinned structure may also be a dual spin-valve sensor, like the dual spin-valve structure for use as a CIP-SV sensor described in U.S. Pat. No. 5,287,238. Referring to FIG. 4, such a sensor would have a second electrically conducting nonmagnetic spacer layer (like layer 130) formed on top of free layer 110 and a second pinned layer (like layer 120) on top of the second nonmagnetic spacer layer. The second pinned layer may be an AP-pinned structure with an AP2 layer according to this invention. Thus a dual CPP-SV sensor according to this invention would have its free layer, and/or one or both of its AP2 layers formed of a Ge-containing ferromagnetic alloy as described above.

Figure 11:
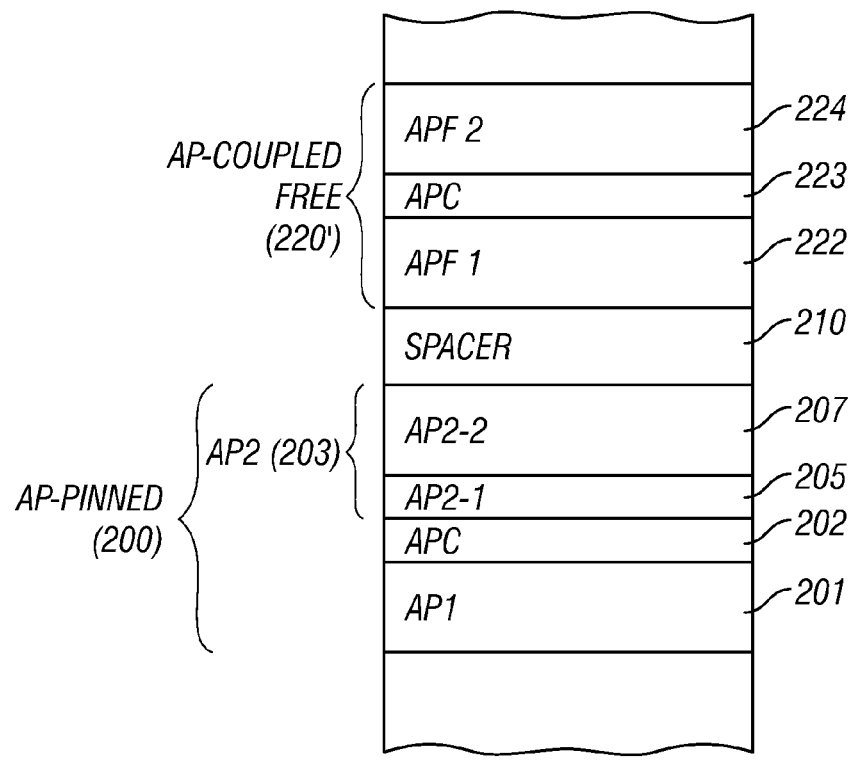
FIG. 11 is a cross-sectional schematic view of another embodiment of the CPP-SV sensor of the present invention sensor with an AP-pinned layer and an antiparallel-coupled free (APF) layer.

The CPP-SV magnetoresistive sensor may also comprise an antiparallel-coupled free (APF) layer. Such a sensor would have a second ferromagnetic free layer substantially antiparallel coupled to first ferromagnetic free layer by use of an APC. In the case of a bottom-pinned sensor, the first ferromagnetic free layer is in contact with the spacer layer and the second ferromagnetic free layer is in contact with the cap, shield, or top-lead structure. FIG. 11 shows a sensor with the AP-pinned layer 200 and an antiparallel-coupled free layer 220'. The APF layer 220' includes first antiparallel free film (APF1) 222 and second antiparallel free film (APF2) 224 separated by APC layer 223. Such a CPP-SV sensor with an APF layer according to this invention would have at least the first free layer 222 formed of a Ge-containing ferromagnetic alloy as described above. Also, APF1 222 may be a multilayer, similar to the AP2 multilayer 203, in which case a first APF1 film comprising the Ge-containing alloy would be located adjacent spacer layer 210, and a second APF1 film comprising a ferromagnetic alloy of one or more of Co, Fe and Ni without Ge would be located above the first APF1 film.

The typical material used for the spacer layers for CPP-SV magnetoresistive sensors is copper (Cu). However, in this invention, wherein at least one of the free and pinned layers comprises the above-described CoFeGe ferromagnetic alloy, it has been discovered experimentally that the use of silver (Ag) spacer layers results in CPP-SV magnetoresistive sensors with better signal performance and thermal stability than those with Cu spacer layers. Thus a spacer layer consisting essentially of Ag is the preferred spacer layer for the CPP-SV magnetoresistive sensors according to this invention. However, because Ag has been shown to provide these improvements, the addition of Ag to Cu will also likely provide improvements over Cu alone. Thus in the CPP-SV magnetoresistive sensors of this invention the spacer layers may be formed of Ag or a AgCu alloy, in addition to Cu.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetoresistive sensor capable of sensing external magnetic fields when a sense current is applied perpendicular to the planes of the layers in the sensor, the sensor comprising:
    a substrate;
    a pinned ferromagnetic layer having an in-plane magnetization direction;
    a free ferromagnetic layer having an in-plane magnetization direction substantially free to rotate in the presence of an external magnetic field; and
    a spacer layer between the free ferromagnetic layer and the pinned ferromagnetic layer and selected from Ag, Cu and a AgCu alloy; wherein at least one of the free and pinned layers comprises a ferromagnetic alloy comprising Co, Fe and Ge, wherein Ge is present in the alloy in an amount between about 20 and 40 atomic percent, and wherein the ratio of Co to Fe in the alloy is between about 0.8 and 1.2.

2. The sensor of claim 1 wherein said Ge-containing alloy consists essentially of only Co, Fe and Ge according to the formula $(Co_xFe_{(100-x)})_{(100-y)}Ge_y$, where the subscripts represent atomic percent, x is between 45 and 55, and y is between 23 and 37.

3. The sensor of claim 1 wherein the free ferromagnetic layer comprises said Ge-containing alloy.

4. The sensor of claim 3 wherein the free ferromagnetic layer comprises an antiparallel-coupled free layer comprising a first free ferromagnetic layer comprising said Ge-containing alloy and having an in-plane magnetization direction, a second free ferromagnetic layer having an in-plane magnetization direction substantially antiparallel to the magnetization direction of the first free ferromagnetic layer, and an AP coupling (APC) layer between and in contact with the first and second free ferromagnetic layers.

5. The sensor of claim 4 wherein the first free layer comprises a multilayer comprising a first film comprising said Ge-containing alloy, and a second film comprising a ferromagnetic alloy of one or more of Co, Fe and Ni.

6. The sensor of claim 5 wherein said second film is between and in contact with said first film and the spacer layer.

7. The sensor of claim 5 wherein said second film is between and in contact with said first film and the APC layer of said antiparallel-coupled free layer.

8. The sensor of claim 1 wherein the pinned layer is an antiparallel (AP) pinned structure comprising a first AP-pinned (AP1) ferromagnetic layer having an in-plane magnetization direction, a second AP-pinned (AP2) ferromagnetic layer adjacent the spacer layer and having an in-plane magnetization direction substantially antiparallel to the magnetization direction of the AP1 layer, and an AP coupling (APC) layer between and in contact with the AP1 and AP2 layers, and wherein at least one of the free, AP1, and AP2 layers comprises said Ge-containing alloy.

9. The sensor of claim 8 wherein the AP-pinned structure is located between the substrate and the free ferromagnetic layer.

10. The sensor of claim 8 wherein the free ferromagnetic layer is located between the substrate and the AP-pinned structure.

11. The sensor of claim 8 wherein the AP-pinned structure is a self-pinned structure.

12. The sensor of claim 8 further comprising an antiferromagnetic layer exchange-coupled to the AP1 layer for pinning the magnetization direction of the AP1 layer.

13. The sensor of claim 8 further comprising a hard magnetic layer in contact with the AP1 layer for pinning the magnetization direction of the AP1 layer.

14. The sensor of claim 8 wherein said AP2 layer comprises said Ge-containing alloy.

15. The sensor of claim 14 wherein the AP2 layer comprises a multilayer comprising a first AP2 film, said first AP2 film comprising a ferromagnetic alloy of one or more of Co, Fe and Ni; and a second AP2 film comprising said Ge-containing alloy.

16. The sensor of claim 15 wherein said second AP2 film is between and in contact with said first AP2 film and the spacer layer.

17. The sensor of claim 1 wherein the sensor is a magnetoresistive read head for reading magnetically recorded data from tracks on a magnetic recording medium, and wherein the substrate is a first shield formed of magnetically permeable material.

18. The sensor of claim 1 wherein the sensor is a dual spin-valve sensor.

19. The sensor of claim 1 wherein the spacer layer consists essentially of Ag.

20. A current-perpendicular-to-the-plane magnetoresistive read head for reading magnetically recorded data from tracks on a magnetic recording medium, the head comprising:
    a first shield layer of magnetically permeable material;
    a seed layer on the first shield layer;
    an antiparallel (AP) pinned structure comprising a first AP-pinned (AP1) ferromagnetic layer on the seed layer and having an in-plane magnetization direction, a second AP-pinned (AP2) ferromagnetic layer having an in-plane magnetization direction substantially antiparallel to the magnetization direction of the AP1 layer, and an AP coupling (APC) layer between and in contact with the AP1 and AP2 layers;
    an electrically conductive nonmagnetic spacer layer on the AP2 layer and selected from Ag, Cu and a AgCu alloy;
    a free ferromagnetic layer on the spacer layer and having an in-plane magnetization direction oriented substantially orthogonal to the magnetization directions of the AP1 and AP2 layers in the absence of an external magnetic field;
    a capping layer on the free ferromagnetic layer; and
    a second shield layer of magnetically permeable material on the capping layer;
    wherein at least one of said free layer and said AP2 layer comprises an alloy consisting essentially of only Co, Fe and Ge according to the formula $(Co_xFe_{(100-x)})_{(100-y)}Ge_y$ where the subscripts represent atomic percent, x is between 45 and 55, and y is between 23 and 37.

21. The head of claim 20 wherein the free ferromagnetic layer comprises a multilayer comprising a first free film comprising said Ge-containing alloy and in contact with the spacer layer, and a second free film comprising a ferromagnetic alloy of one or more of Co, Fe and Ni without Ge and in contact with the first free film.

22. The head of claim 20 wherein the AP2 layer comprises a multilayer comprising a first AP2 film comprising a ferromagnetic alloy of one or more of Co, Fe and Ni without Ge; and a second AP2 film comprising said Ge-containing alloy.

23. The head of claim 22 wherein said first AP2 film is in contact with the APC layer.

24. The head of claim 20 wherein the spacer layer consists essentially of Ag.

* * * * *